United States Patent [19]

Chen et al.

[11] Patent Number: 4,471,370

[45] Date of Patent: Sep. 11, 1984

[54] MAJORITY CARRIER PHOTODETECTOR

[75] Inventors: Chung Y. Chen, Scotch Plains; Alfred Y. Cho, Summit, both of N.J.

[73] Assignee: AT&T Bell Laboratories, Murray Hill, N.J.

[21] Appl. No.: 257,355

[22] Filed: Apr. 24, 1981

[51] Int. Cl.³ .................. H01L 29/161; H01L 27/14; H01L 29/12
[52] U.S. Cl. ...................................... 357/30; 357/16; 357/58
[58] Field of Search ................. 357/30, 16, 63, 61, 357/58

[56] References Cited

U.S. PATENT DOCUMENTS

| | | | |
|---|---|---|---|
| 4,008,485 | 2/1977 | Miyoshi et al. | 357/63 X |
| 4,254,429 | 3/1981 | Yamazaki | 357/61 X |
| 4,353,081 | 10/1982 | Allyn et al. | 357/30 |
| 4,410,902 | 10/1983 | Malik | 357/58 |

OTHER PUBLICATIONS

R. A. Milano et al., "$Al_{0.5}Ga_{0.5}As$-GaAs Heterojunction Phototransistors Grown by Metalorganic Chemical Vapor Deposition", *Applied Physics Letters*, vol. 34, (1979), pp. 562-564.
M. Konagai et al., "(GaAl)As/GaAs Heterojunction Phototransistors with High Current Gain", *Journal of Applied Physics*, vol. 48, (1977), pp. 4389-4394.
H. J. Hovel, "Graded Bandgap Heterojunction Bipolar Transistor", *IBM Technical Disclosure Bulletin*, vol. 22, (1980), p. 3875.
D. L. Rogers, "Heterojunction Phototransistor", *IBM Technical Disclosure Bulletin*, vol. 23, (1981), p. 4763.
R. J. Malik et al., "Planar-doped Barriers in GaAs by Molecular Beam Epitaxy", *Electronics Letters*, vol. 16, (1980), pp. 836-838.
J. C. Campbell et al., "InP/InGaAs Heterojunction Bipolar Phototransistors with Improved Sensitivity", *International Electron Devices Meeting Technical Digest*, Washington, D.C., (1980), pp. 526-529.
J. C. Campbell et al., "InP/InGaAs Heterojunction Phototransistors", *IEEE Journal of Quantum Electronics*, vol. QE-17, (1981), pp. 264-269.
J. M. Shannon, "A Majority-Carrier Camel Diode", *Applied Physics Letters*, vol. 35, (1979), pp. 63-65.

*Primary Examiner*—Martin H. Edlow
*Assistant Examiner*—J. Carroll
*Attorney, Agent, or Firm*—Richard D. Laumann

[57] ABSTRACT

A majority carrier photodetector has high sensitivity and fast response times. The photodetector comprises a thin highly doped layer surrounded on either side by two nominally undoped layers which are completely depleted at thermal equilibrium.

10 Claims, 3 Drawing Figures

MAJORITY CARRIER PHOTODETECTOR

TECHNICAL FIELD

This invention relates generally to photodetectors and particularly to majority carrier photodetectors.

BACKGROUND OF THE INVENTION

The development of optical communications systems using silica-based optical fibers has stimulated interest in light sources and photodetectors capable of operating within the wavelength region, generally between approximately 0.7 μm (micrometer) and approximately 1.6 μm, of interest to such systems. A photodetector is an essential component of such a system and as a result, much effort has been directed toward developing structures and materials for photodetectors.

The photodetectors presently contemplated for use in fiber-based optical communications systems fall into three general categories. First, there are p-i-n photodiodes. However, these suffer the drawback of not having any current gain. Second, avalanche photodiodes have been developed and these, of course, have current gain. However, the avalanche process introduces noise which is undesirable for many communications systems purposes. Further, a large bias voltage, typically more than 30 volts, is generally required to obtain avalanching. Third, high sensitivity phototransistors have been developed. However, these devices generally have low optical gain in the low incident power region where optical communications systems operate and where high gain is most critically needed. Further, the response time for phototransistors is often slower than that desired because of minority carrier storage in the base region.

The problem of minority carrier storage and the resulting undesirably slow response time can be alleviated, if not totally eliminated, by using majority carrier devices which lack minority carrier storage and will give faster response times. Perhaps the first and best known majority carrier diode is the Schottky barrier diode which has a metal-semiconductor interface. Other types of majority carrier devices have been developed recently. For example, *Applied Physics Letters*, 35, pp. 63-65, July 1, 1979 reported a majority carrier device which, perhaps in a flight of fancy, the author termed a camel diode. The device was so designated because there is a hump in the conduction band formed by a thin and highly doped p-type layer that controls the carrier transport. The doping concentration in this layer is such that it is fully depleted of holes at all bias values. Another version of this device was reported in *Electronics Letters*, 16, pp. 836-838, Oct. 23, 1980. This device has the p-type layer which controls the carrier transport embedded between nominally undoped semiconductor layers.

The devices reported in both articles, however, are rectifying devices. Although the latter article suggested that the devices could be used as mixer diodes, no other uses are suggested in either article and the devices disclosed in both articles are not suitable for use as photodetectors.

SUMMARY OF THE INVENTION

We have found that a photodetector comprising, as sequentially disposed layers, a first semiconductor layer having a first conductivity type, a second semiconductor layer which is undoped, a third semiconductor layer having a second conductivity type and which is highly doped and thin, a fourth semiconductor layer which is undoped, and a fifth semiconductor layer having a first conductivity type, has a rapid response time. High sensitivity is also obtained. The fourth and fifth layers have bandgaps such that the layers are transparent to the radiation of interest while the second layer has a bandgap such that it absorbs the incident radiation, i.e., the fourth and fifth layers have bandgaps greater than the bandgap of the second layer. The third layer may also have a bandgap such that it absorbs incident radiation. The layer thicknesses and doping levels are selected so that the layer having the second conductivity type and the two undoped layers, i.e., the second, third and fourth layers, are completely depleted at thermal equilibrium.

In a preferred embodiment, the first conductivity type is n-type. In an embodiment preferred for operation at an incident light wavelength of approximately 0.8 microns, the first, second and third layers comprise GaAs, and the fourth and fifth layers comprise $Al_x Ga_{1-x}As$, with x selected so that the layers are lattice matched and, when the device is front illuminated, act as a window for the incident radiation. Silicon and beryllium are used for the n- and p-type dopants, respectively. In a further preferred embodiment, the second layer has a thickness sufficient to absorb essentially all incident radiation of interest.

DETAILED DESCRIPTION

Figure 1:
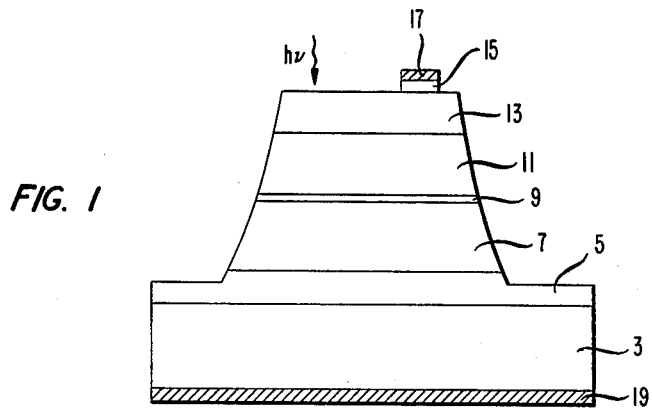
FIG. 1 is a cross-sectional view of one embodiment of a photodetector of this invention.

An embodiment of a photodetector 1 of this invention is shown in cross-section in FIG. 1. For reasons of clarity, the elements are not drawn to scale. The device comprises semiconductor substrate 3 having a first conductivity type, a first semiconductor layer 5 having a first conductivity type, a second semiconductor layer 7 which is undoped, a third semiconductor layer 9 having a second conductivity type and which is highly doped and thin, a fourth semiconductor layer 11 which is undoped, and a fifth semiconductor layer 13 having a first conductivity type. There is also a semiconductor contact layer 15 which has a first conductivity type and upon which electrical contact 17 is disposed. There is also an electrical contact 19 to the substrate. Layers 11 and 13 have bandgaps that make them transparent to the incident radiation, which is shown as hν, while layer 7 has a bandgap such that it will absorb incident radiation of interest, i.e., layer 7 has a bandgap that is less than the bandgaps of layers 11 and 13. Layers 5 and 9 may also have bandgaps less than the bandgaps of layers 11 and 13 and absorb incident radiation.

Photodetectors of this invention have rapid response times, typically less than 600 psec full width at half maximum and high sensitivity, typically greater than 500 Amp/w.

Layer 5 is a buffer layer that is conventionally grown so that the additional epitaxial layers are grown on a high quality layer rather than the usually relatively low quality substrate. If the buffer layer is omitted, the substrate is then equivalent to the first semiconductor layer. Layers 7, 9 and 11 may also be referred to drain, gate and source, respectively.

The device is conveniently fabricated by molecular beam epitaxy (MBE). A suitable MBE system is described in sufficient detail in U.S. Pat. No. 4,137,865 issued on Feb. 6, 1979 to Alfred Y. Cho to teach one of ordinary skill in the art how to fabricate the epitaxial layers and the photodetectors of this invention. The electrical contacts are made with well-known and conventional techniques. The mesa structure, as well as layer 15, are made with well-known and conventional etching and lithographic techniques. The device may be fabricated with other techniques.

The first conductivity type may be either n- or p-type. In the embodiment discussed in detail later, it is n-type which was chosen because it facilitates monolithic integration with other types of devices such as lasers and field effect transistors (FETs). The choice of first conductivity type also leads to different device characteristics. In general, n-type as the first conductivity type produces devices that are more sensitive but have slower response times when compared to devices that have p-type as the first conductivity type.

The preferred layer thicknesses and doping concentrations are obtained as follows. Layers 9 and 7, i.e., the gate and drain regions, should together be thick enough to absorb essentially all of the incident radiation. For most semiconductors and wavelengths of interest, layer 7 should be at least 1 $\mu$m thick. Thinner layers may, of course, be used but because some of the incident photons will pass through both the gate and drain, rather than being absorbed, either device sensitivity will be reduced or a diffusion tail might result from light absorption in layer 5 or the substrate.

The semiconductors comprising layers 7, 9 and 11 are selected so that the barrier height, $\phi_B$, is chosen so that $E_v$, the energy level of the valence band, does not cross $E_f$ where $E_f$ is the Fermi level energy. In fact, $E_v$ should be at least several kT away from $E_f$ for efficient photodetector operation. If this condition is not satisfied, layer 9 cannot be completely depleted. The barrier height is approximately determined by the relationship $$\phi_B = \frac{L_1 L_2}{L_1 + L_2} \frac{Q_s}{\epsilon_s}$$

where $L_1$ and $L_2$ are the thicknesses of the source and drain, respectively, and $Q_s$ is the number of carriers/cm$^2$ in layer 9 and $\epsilon_s$ is the permittivity of layer 9. In general, device efficiency increases as $\phi_B$ is smaller but the dark current increases. The precise choice of $\phi_B$ is thus a compromise between sensitivity and dark current.

Layers 7, 9 and 11 have thicknesses and dopant concentrations selected so that layers 7, 9 and 11 are completely depleted at thermal equilibrium. It is desired that these layers be completely depleted at thermal equilibrium so that the photodetector is a majority carrier device at all bias voltages. Layer 9 should be thin and highly doped. The term highly doped is used in comparison with the undoped layers and means a carrier concentration of at least $5 \times 10^{17}$ cm$^{-3}$. The layer should be highly doped to obtain the desired barrier height. The term thin means that layer 9 is completely depleted at thermal equilibrium. It may not be possible to completely deplete layer 9 if it is too thick. The maximum thickness for complete depletion is generally 100 Angstroms or less. As layer 9 becomes thicker, the undoped layers become thinner. It is to be understood that the term undoped as applied to layers 7 and 11 means not intentionally doped and there may be background doping, generally p-type, in these layers at a concentration, less than $5 \times 10^{15}$/cm$^3$ and generally less than $8 \times 10^{13}$/cm$^3$. The lower concentration is desirable because it facilitates depletion of both the undoped and highly doped layers. The total dopant concentration in layers 7, 9 and 11 must be small enough to permit the internal electric field to deplete the layers at thermal equilibrium.

The semiconductor layers may comprise any semiconductor materials that lattice match to each other, i.e., that have lattice parameters that differ by less than 0.1 percent. For example, Group II–VI or III–V semiconductor compounds and mixtures thereof may be used. If Group III–V compounds are used, the fourth and fifth layers may comprise AlGaAs while the first, second and third layers, as well as the substrate, comprise GaAs. The lattice matched compositions are GaAs and Al$_x$Ga$_{1-x}$As with x selected, in a well-known manner, so that the GaAs and Al$_x$Ga$_{1-x}$As layers are lattice matched. As examples, x may equal 0.2 or 0.3 as well as intermediate values.

Silicon and beryllium are used, in a preferred embodiment for AlGaAs and GaAs, for the n- and p-type dopants, respectively. The choice of silicon, rather than tin which is used in most AlGaAs/GaAs laser fabrications, is unusual. However, silicon is preferred as the dopant because it provides the abrupt doping profile that is required for the majority carrier photodetector.

The invention will be illustrated by reference to photodetectors made with AlGaAs and GaAs. Typical layer thicknesses and doping concentrations for these photodetectors with the first conductivity type being n-type are: layer 5, 2 $\mu$m; layer 7, 2 $\mu$m; layer 9, $2 \times 10^{18}$ cm$^{-3}$ and 60 Angstroms; layer 11, 500 to 2000 Angstroms; layer 13, $2 \times 10^{18}$ cm$^{-3}$ and 0.6 to 2 $\mu$m; and layer 15, $5 \times 10^{19}$ cm$^{-3}$ and 0.3 $\mu$m. The undoped layers had a p-type background carrier concentration $8 \times 10^{13}$ cm$^{-3}$. These values result in depletion of layers 7, 9 and 11 at thermal equilibrium.

Figure 2:
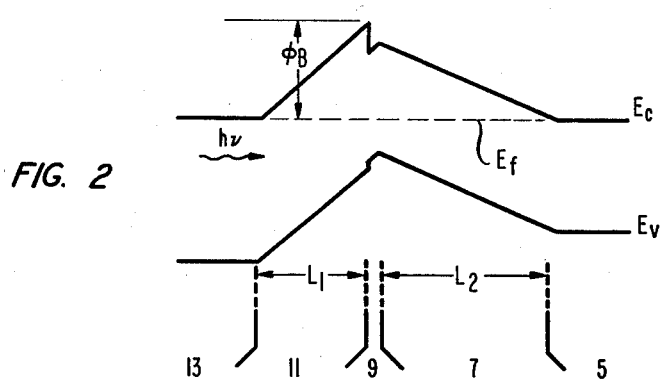
FIG. 2 is an energy band diagram of one embodiment of a photodetector of this invention.

FIG. 2 shows the energy band diagram of an AlGaAs/GaAs photodetector at thermal equilibrium. The layer thicknesses, for reasons of clarity, are not drawn to scale. The layer compositions of this embodiment are as described previously and the direction of the incident photons is also shown.

The operation of the device will be briefly described. The device with an n-type substrate is operated with the substrate and drain positively biased with respect to the window or source layer. It will be assumed that a light source (not shown) emits photons having an energy intermediate the bandgap energies of layers 11 and 7 and the gate and drain have the same composition. The photons will be then absorbed both in the gate and drain regions, although primarily in the drain region, and electron hole pairs will be produced and separated there by the electric field existing in the drain region. The holes drifting down to the potential minimum soon experience a potential barrier and a fraction of the holes will accumulate at the potential minimum. If accumulation proceeds for a sufficiently long time period, a steady state will be reached at the point where the rate of incoming flux equals the rate of outgoing flux. The latter flux is due to either recombination with electrons or thermionic emission over the potential barrier. The accumulated holes lower the potential barrier and thus enhance majority carrier, that is, electron emission from the source. For the photogenerated case where the current is small compared to the dark current, as is generally true for weak incident power, we have derived the following expression to describe the optical gain:

$$G = \frac{J_d(h\nu)}{p_i q} [\exp(q\Delta\phi_B/kT) - 1].$$

In this equation, $J_d$ is the dark current per unit area, $p_i$ is the incident power per unit area and $\Delta\phi_B$ is the barrier lowering due to the incident radiation. Other terms have their previous meanings. As the incident power increases, the amount of barrier lowering $\Delta\phi_B$ gradually saturates and makes the optical gain gradually decrease with increasing power. That is, the device sensitivity increases as the incident power decreases.

It is believed that carrier transport in the majority carrier photodetector under normal operating conditions is due primarily to thermionic emission of the majority carriers over the potential barrier. Normal operating conditions mean that the drain is positive and negative, with respect to the source, for n- and p-type substrates, respectively. The bias voltage is typically between 5 and 10 volts.

It has been pointed out, by for example, Bethe, see, for example, MIT Radiation Laboratory, Report No. 43-12, 1942, that thermionic emission prevails when practically all of the carriers moving towards the potential maximum are stopped by the potential rather than by collisions. Stated in other words, this means that the distance over which the potential energy changes by kT should be smaller than the mean free path for momentum randomizing collisions. This hypothesis was confirmed by a linear relationship in the log I vs. V plot for an n-type AlGaAs/GaAs photodetector.

Figure 3:
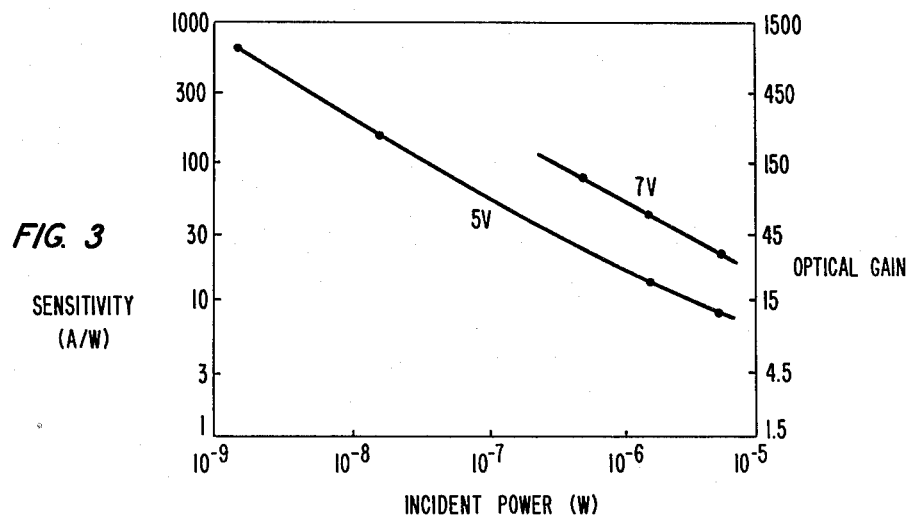
FIG. 3 shows the optical gain and sensitivity of one photodetector as a function of different incident power levels for two different biases.

FIG. 3 shows the dependence of both the sensitivity and the optical gain on the incident power for an n-type first conductivity type an AlGaAs/GaAS photodetector both 5 volt and 7 volt biases. The device parameters were as described previously with layers 11 and 13 having thicknesses of 0.05 μm and 0.6 μm, respectively. The mesa was oval shaped with an area of approximately $1.3 \times 10^{-4}$ cm$^{-2}$. The sensitivity and optical gain are plotted on the left and right vertical axes, respectively. The measurements shown on FIG. 3 were made by mounting a photodetector onto a 50 ohm strip line and using an AlGaAs/GaAS injection laser emitting at 8300 Angstroms as the light source. Sensitivity measurements were performed directly using a calibrated curve tracer. The optical gain is related to the sensitivity by the equation $G=S(h\nu)/q$ where $h\nu$ is the incident photon energy and q is the electron charge. It should be noted that the optical gain increases as the incident power level decreases. Optical gains as high as 1000 were obtained for an incident power of 1.5 nW. This result appears to be better than any phototransistor optical gain reported.

Although the sensitivity increases with increasing bias voltage, it should be noted that the dark current also increases with increasing bias voltage. Consequently, the optimum bias voltage depends on the amount of dark current that the optical communications system can tolerate.

Operation with relatively constant dark current is important because the gain is proportional to the dark current and, if the dark current fluctuates greatly with bias fluctuations, the stability of the device will be reduced. The magnitude of the dark current is controlled by the relative thicknesses of the source and drain. These conditions, i.e., the drain and source thicknesses, result in a highly asymmetric dark I-V characteristic. The considerations just discussed with respect to layer thicknesses result in a dark current that is relatively insensitive to small fluctuations in the bias voltage.

The response time of the n-type first conductivity type AlGaAs/GaAs photodetector was examined with 40 psec pulses having a peak power of 20 mW from the laser previously mentioned. The rise time was approximately 50 psec. The fall time was approximately 600 psec. It is believed that the fall time is limited by an RC time constant. A p-type first conductivity type AlGaAs/GaAs photodetector that was a counterpart to the n-type photodetector was similarly examined and had a response time of 60 psec for full width at half maximum.

Embodiments other than that specifically described are possible. For example, the photodetector may be back illuminated with an improved fall time. In this case, substrate 3 and layers 5 and 7 would be transparent to the incident radiation. Also, the order in which the semiconductor layers are grown on the substrate is fifth, fourth, third, second and first. Further, the InGaAs/InP system may be used to fabricate photodetectors sensitive near 1.3 μm.

What is claimed is:

1. A photodetector comprising as sequentially disposed layers:
   a first semiconductor layer having a first conductivity type; a second semiconductor layer which is undoped, a third semiconductor layer having a second conductivity type and which is highly doped and thin, a fourth semiconductor layer which is undoped, said second, third and fourth layers being depleted at thermal equilibrium, and a fifth semiconductor layer having a first conductivity type, said fourth and fifth semiconductor layers having bandgaps greater than the bandgaps of said second and third semiconductor layers, first and second electrical contacts to said first and fifth semiconductor layers, respectively.

2. A photodetector as recited in claim 1 in which said third layer has a carrier concentration greater than $5 \times 10^{17}$ cm$^{-3}$.

3. A photodetector as recited in claim 2 in which said third layer has a thickness less than 100 Angstroms.

4. A photodetector as recited in claim 3 in which said second and fourth layers have carrier concentrations less than $5 \times 10^{15}$ cm$^{-3}$.

5. A photodetector as recited in claim 4 in which said carrier concentrations are less than $8 \times 10^{13}$ cm$^{-3}$.

6. A photodetector as recited in claims 1 or 5 in which said second layer is at least 1 μm thick.

7. A photodetector as recited in claims 1 or 4 in which said semiconductor layers comprise compounds selected from the group consisting of Group II-VI and Group III-V compounds and mixtures thereof.

8. A photodetector as recited in claim 7 in which said first, second and third semiconductor layers comprise GaAs and said fourth and fifth semiconductor layers comprise $Al_xGa_{1-x}As$.

9. A photodetector as recited in claim 8 in which said first conductivity type is n-type.

10. A photodetector as recited in claim 9 in which said n-type dopant is silicon.

* * * * *